United States Patent [19]

Ichihara et al.

[11] Patent Number: 5,071,240
[45] Date of Patent: Dec. 10, 1991

[54] REFLECTING OPTICAL IMAGING APPARATUS USING SPHERICAL REFLECTORS AND PRODUCING AN INTERMEDIATE IMAGE

[75] Inventors: Yutaka Ichihara, Yokohama; Akira Higuchi, Matsudo, both of Japan

[73] Assignee: Nikon Corporation, Tokyo, Japan

[21] Appl. No.: 578,787

[22] Filed: Sep. 7, 1990

[30] Foreign Application Priority Data

Sep. 14, 1989 [JP] Japan .................................. 1-239551
Sep. 19, 1989 [JP] Japan .................................. 1-242505

[51] Int. Cl.⁵ .............................................. G02B 17/06
[52] U.S. Cl. ...................................... 359/366; 359/859
[58] Field of Search ........................ 350/505, 620, 442

[56] References Cited

U.S. PATENT DOCUMENTS

| | | | |
|---|---|---|---|
| 4,293,186 | 10/1981 | Offner | 350/505 |
| 4,496,824 | 1/1985 | Kawai et al. | 346/76 PH |
| 4,552,064 | 11/1985 | Sanders, Jr. et al. | 400/124 |
| 4,625,137 | 11/1986 | Tomono | 310/317 |
| 4,661,002 | 4/1987 | Ara | 400/124 |
| 4,664,542 | 5/1987 | Tsugita | 101/93.05 |
| 4,685,777 | 8/1987 | Hirose | 350/505 |
| 4,697,939 | 10/1987 | Ara | 400/124 |
| 4,701,035 | 10/1987 | Hirose | 350/505 |
| 4,747,678 | 5/1988 | Shafer et al. | 350/505 |
| 4,776,712 | 10/1988 | Okuno et al. | 101/93.05 |
| 4,802,776 | 2/1989 | Miyazawa et al. | 400/124 |
| 4,812,029 | 3/1989 | Matsumoto | 350/505 |
| 4,861,148 | 8/1989 | Sato et al. | 350/505 |

FOREIGN PATENT DOCUMENTS

| | | | |
|---|---|---|---|
| 47915 | 3/1986 | Japan | 350/504 |
| 123812 | 6/1986 | Japan | 350/620 |
| 212815 | 9/1986 | Japan | 350/620 |
| 63-311315 | 12/1988 | Japan | |
| 637772 | 12/1978 | U.S.S.R. | 350/442 |

*Primary Examiner*—Jon W. Henry
*Attorney, Agent, or Firm*—Shapiro and Shapiro

[57] ABSTRACT

A reflecting imaging optical apparatus comprises a reflecting spherical optical system including a first spherical reflecting optical system and a second spherical reflecting optical system, and a spherical reflecting mirror disposed near the position of an intermediate image formed by the reflecting spherical optical system. The first and second spherical reflecting optical systems form concentric optical systems, respectively.

10 Claims, 7 Drawing Sheets

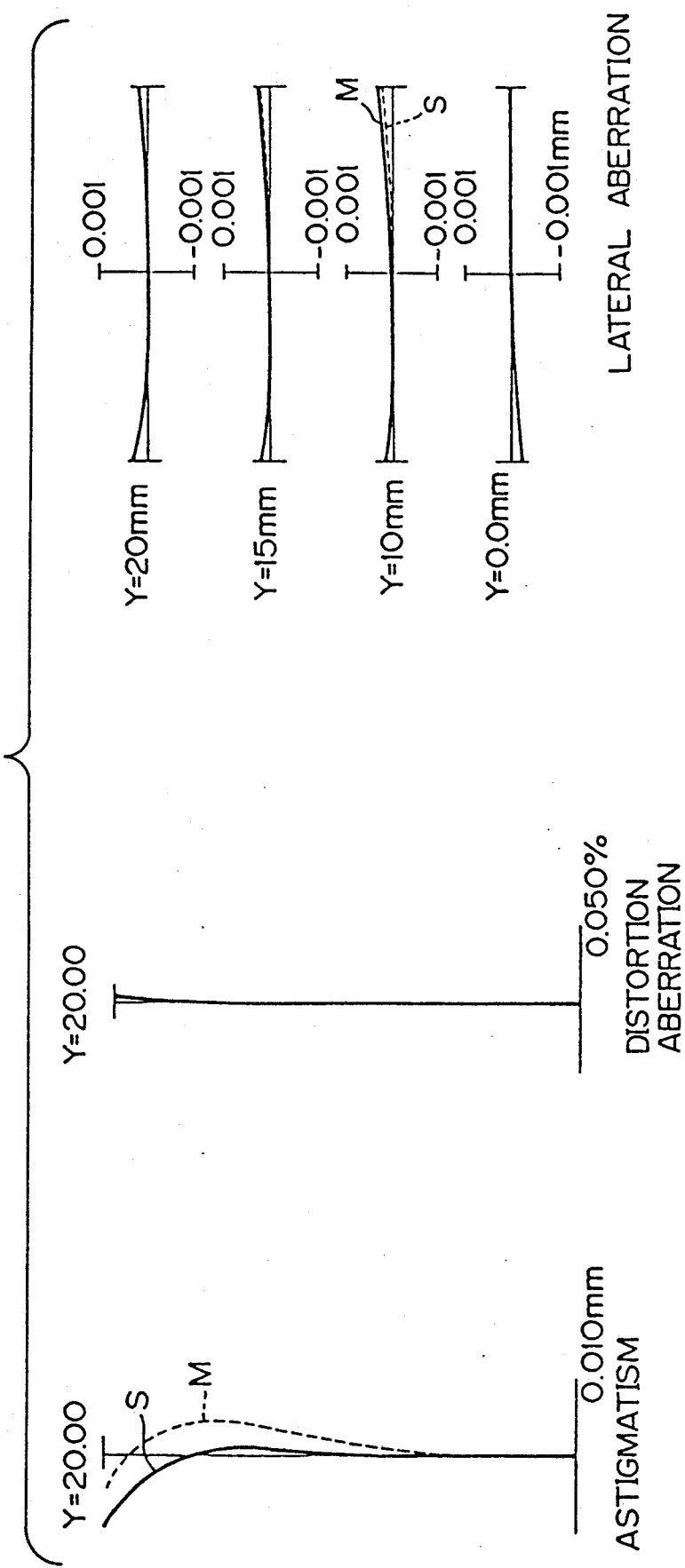

FIG.13
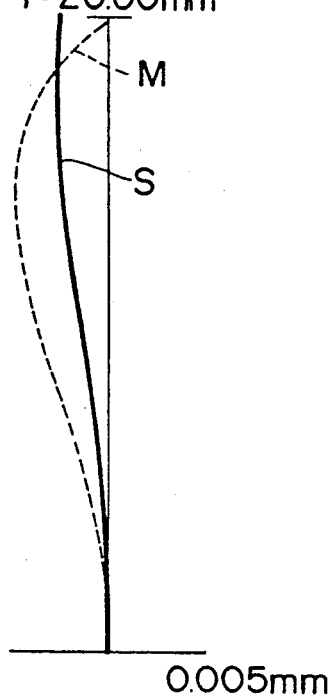
Y=20.00mm
M
S
0.005mm
ASTIGMATISM
FIG.14
Y=20.00mm
0.010%
DISTORTION ABERRATION
FIG.15
Y - - - SKEW - - - Z
Y=20mm
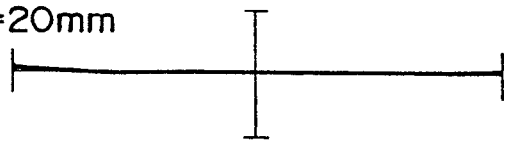
Y=15mm
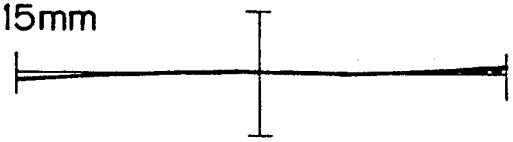
Y=10mm
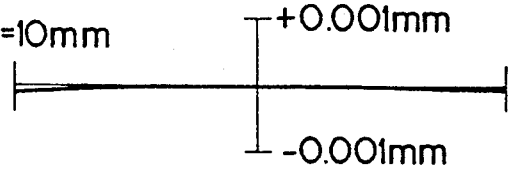
+0.001mm
-0.001mm
LATERAL ABERRATION

REFLECTING OPTICAL IMAGING APPARATUS USING SPHERICAL REFLECTORS AND PRODUCING AN INTERMEDIATE IMAGE

BACKGROUND OF THE INVENTION

1. Field of the Invention

This invention relates to a reflecting mirror optical system, and in particular to a reflecting reduction-projecting optical apparatus for reduction-projecting the pattern of a mask (negative) onto a wafer having photoresist applied thereto in the manufacture of a semiconductive integrated circuit.

2. Related Background Art

Exposure apparatuses for the manufacture of semiconductors such as steppers have heretofore used near-ultraviolet light. In recent years, excimer laser and far-ultraviolet light of shorter wavelength have also been used, and with the tendency of integrated circuit patterns toward minuteness, exposure apparatuses of higher resolving power have been desired. The resolving power is determined by exposure wavelength and the numerical aperture of the optical system, and the shorter is the exposure wavelength and the greater is the numerical aperture, exposure transfer of the more minute pattern becomes possible, but it is not advisable to make the numerical aperture great because it involves difficulties in optical design and results in a shallow depth of focus and thus, attempts to shorten the exposure wavelength have been made.

For the manufacture of a semiconductor element comprising a very minute pattern and having a memory capacity of the order of 256 Mbit or more, such as super-LSI, it becomes necessary to exposure-transfer a line width (pattern) of 0.25 μm or less and for this purpose, it becomes indispensable to use soft X-rays or X-rays.

Exposure apparatuses using X-rays have already been developed, but those so far developed are of the so-called proximity type in which the shadow picture of a mask is transferred to a wafer, and requires exacting pattern accuracy of the mask and involves difficulties in the manufacture of the mask. Therefore, a reflecting reduction optical system which reduces a mask image and projects and transfers it onto the surface of a wafer is regarded as promising.

As a reflecting reduction optical system, there is one by Shafer et al. disclosed, for example, in U.S. Pat. No. 4,747,678. This is basically comprised of three concave reflecting mirrors and a convex reflecting mirror, but due to aberrations (coma and spherical aberration) caused by the convex mirror for effecting reduction, it is insufficient to obtain such a degree of resolving power that is used for the manufacture of a semiconductor element. A construction in which a refracting member is added to correct these aberrations has also been proposed at the same time and by the introduction of the refracting member, a good formed image is obtained in an arcuate field of view for the first time. However, the refracting member does not stand practical use in a soft X-ray or X-ray area.

Reflecting reduction optical systems by Suzuki et al. have also been proposed as disclosed in Japanese Laid-Open Patent Application No. 63-311315, etc., but these introduces therein an aspherical reflecting mirror for the correction of aberrations and the manufacture of such optical systems becomes remarkably difficult.

Accordingly, the reflecting surface which can be practically used is only a spherical surface. The Schwarzschild type has long been known as a reflecting optical system comprised of only a spherical surface. As shown in FIG. 8 of the accompanying drawings, this is an optical system comprised of two concentric spherical reflecting mirrors, i.e., a concave mirror 1 and a convex mirror 2, and is a very excellent optical system. However, its only disadvantage is that it is a concentric optical system and therefore its object plane and image plane are spherically curved about the centers of sphere of the reflecting mirrors. If the object plane is made into a flat plane, the image plane will be further curved. Therefore, this optical system could not be used in a semiconductor manufacturing apparatus which required a wide exposure area.

SUMMARY OF THE INVENTION

It is an object of the present invention to provide a reflecting imaging optical apparatus which is of a simple construction comprising only spherical surfaces and yet can form a flat imaging plane over a wide area and is capable of reduction projection.

It is another object of the present invention to provide a reflecting reduction projection optical apparatus which is capable of exposure in a soft X-ray or X-ray area and is capable of accomplishing reduction projection so that any difficulty in the manufacture of a mask may not be encountered and which can obtain an excellent imaging performance even when it comprises only spherical reflecting mirrors easy to manufacture.

According to the present invention, curvature of image field which is created and cannot be fully corrected by at least one set of concentric optical systems can be corrected well by a spherical reflecting mirror disposed near the intermediate imaging plane. The method of designing this spherical mirror for correcting curvature of image field is as follows.

Let it be assumed that two concentric optical systems $S_1$ and $S_2$ as in a first embodiment shown, for example, in FIG. 1 of the accompanying drawings are combined together. Let it also be assumed that the reduction projecting magnification by the entire system is $1/M$ and that the first optical system $S_1$ of magnification $1/m_1$ and the second optical system $S_2$ of magnification $1/m_2$ are combined together to obtain a reduction projecting optical systems of $1/M$. That is, let it be assumed that $M = m_1 \times m_2$.

Suppose the first optical system $S_1$ of magnification $1/m_1$, and let it be assumed that the object plane $O_1$ thereof is a flat plane. Next, let it be assumed that the image plane $I_2$ of the second optical system $S_2$ of magnification $1/m_2$ is a flat plane and the size of the image $a_f$ thereof is $1/M$ of the object $a_0$ of the first optical system. The arrangement of the object and image of the second optical system $S_2$ is made opposite to that of the first optical system, and the optic axis of the respective optical systems are made coincident with each other, and the image plane $I_1$ of the first optical system $S_1$ and the object plane $O_2$ of the second optical system $S_2$ are made coincident with each other on the optic axis. Thereupon, as shown in FIG. 2 of the accompanying drawings, the image plane $I_1$ of the first optical system and the object plane $O_2$ of the second optical system are roughly spherically curved and their sizes are equal to each other, but their degrees of curvature differ from each other. Supposing a curved plane M formed by linking the mid-point between the corresponding points of the image plane $I_1$ of the first optical system and the object plane $O_2$ of the second optical system, this plane also is substantially spherical, and if this plane M is a mirror surface, the image plane $I_1$ of the first optical system and the object plane $O_2$ of the second optical system are conjugate with each other with the reflecting surface M interposed therebetween.

As a result, a planar object $a_0$ on the object plane $O_1$ of the first optical system is imaged as a planar image of $1/M$ on the image plane $I_2$ of the second optical system, and a flat image of the planar object is formed at a desired magnification without curvature of image field.

It is to be understood that the optic axis A in the concentric optical systems is defined as a straight line passing through the center of concentricity and perpendicular to the object plane and the image plane when the object plane and the image plane are given.

Now, the design of the spherical mirror for correcting curvature of image field will be described in another way. An optical system free of curvature of image field is an optical system in which Petzval sum is zero. When in the concentric optical systems, the radii of curvature of the respective reflecting surfaces are $r_1, r_2, \ldots, r_n$, Petzval sum P is $$P = 1/r_1 + 1/r_2 + 1/r_3 + \ldots + 1/r_n \qquad (1)$$

and therefore, it is the condition for which curvature of image field is null that the value of this equation (1) is 0.

Accordingly, if each of the concentric optical systems is a Schwarzschild optical system comprising two concentric reflecting surfaces, when $r_1$ and $r_2$ are the radii of curvature of the first Schwarzschild optical system and $r_3$ and $r_4$ are the radii of curvature of the second Schwarzschild optical system, the radius of curvature r of the spherical mirror M for correcting curvature of image field which is placed near the intermediate image position is given by $$r_M = \frac{-1}{1/r_1 + 1/r_2 + 1/r_3 + 1/r_4} \qquad (2)$$

This equation (2) more strictly is as follows when the refractive index of the incident light side of the kth surface is $N_k$ and the refractive index of the emergent light side thereof is $N_k'$ and the refractive index of the incident light side of the correcting reflecting surface is $N_m$ and the refractive index of the emergent light side thereof is $N_m'$.

$$r_M = \frac{-(N_m' - N_m)}{\sum_{k=1}^{4} \frac{N_k' - N_k}{r_k}} \qquad (3)$$

Here, the refractive indices $N_k'$, $N_k$, etc. are 1 or $-1$, and as regards the sign thereof, like the spacing between the reflecting surfaces which will be described later, the case where the direction of light rays is leftward is positive, and the case where the direction of light rays is rightward is negative.

Of course, this spherical surface coincides with the reflecting mirror for correcting the image plane previously described in connection with FIG. 2.

Likewise, when the radii of curvature of the reflecting surfaces of the entire system including the concentric optical systems are $r_1, r_2, \ldots, r_n$ and the ith reflecting surface among them is the reflecting surface for correcting the image plane disposed near the intermediate image position, the radius of curvature $r_M$ thereof is generally given by $$r_M = \frac{-(N_m' - N_m)}{\sum_{k=1}^{i-1} \frac{N_k' - N_k}{r_k} + \sum_{k=i+1}^{n} \frac{N_k' - N_k}{r_k}} \qquad (4)$$

In practice, it is necessary that the radius of curvature of the reflecting surface for correcting the image plane determined by the equation (4) above be suitably modified in conformity with the balance with the remaining aberrations in the Schwarzschild optical systems and the optical system combined therewith. In that case, it is effective that the final value r of the radius of curvature of the reflecting surface for correcting the image plane is set to the range of $$|r - r_M| \leq \frac{\lambda}{Y^2(NA)^2} r_M^2 \qquad (5)$$

relative to the value $r_M$ determined by the equations (3) and (4).

Here, $\lambda$ is wavelength, Y is the image height of the final image, and NA is the numerical aperture corresponding to the angle of opening of the imaging light flux on the final image plane.

The condition (5) above is a condition determined on the basis of the relation between the amount of deviation $\Delta = -Y^2(N_k'P)$ of the Petzval image plane from the Gauss image plane which is formed by the tertiary aberration theory and the depth of focus $\Delta Z = \pm \lambda/2(NA)^2$ in the optical system of diffraction limit, and if the range of this condition is exceeded, high-order aberrations created in the reflecting surface for correcting the image plane will become too remarkable and therefore, it will become difficult to obtain good imaging.

Further, a reflecting reduction optical apparatus according to the present invention, as shown in the schematic construction views of FIGS. 9 to 12 of the accompanying drawings, has a first optical system $S_1$ for forming a virtual image of magnification of approximately 1 of an object O on the object plane, a second optical system $S_2$ for forming a reduced real image from the virtual image formed by the first optical system, and a third optical system $S_3$ for forming an image of approximately one-to-one magnification from the real image formed by the second optical system.

The first optical system $S_1$ has a concave reflecting surface and a convex reflecting surface as a first reflecting surface $R_1$ and a second reflecting surface $R_2$, respectively, disposed substantially concentrically, and a predetermined optic axis $A_1$, and the object plane O and image plane $I_1$ of the first optical system substantially lie in a plane substantially containing the center of concentricity $C_1$ and perpendicular to the optic axis of the first optical system, or a plane optically equivalent to said plane. The second optical system $S_2$ has a convex reflecting surface and a concave reflecting surface as a third reflecting surface $R_3$ and a fourth reflecting surface $R_4$, respectively, disposed substantially concentrically with $C_2$ as the center of concentricity, a concave reflecting surface as a fifth reflecting surface $R_5$ substantially disposed at the position of a real image $I_2$ formed by the third reflecting surface and the fourth reflecting surface, and a predetermined optic axis $A_2$. The third optical system $S_3$ has a concave reflecting surface as a sixth reflecting surface $R_6$ and a predetermined optic axis $A_3$, and the object plane $O_3$ and image plane I of the third optical system substantially lie in a plane substantially containing the center of curvature $C_3$ of the sixth reflecting surface $R_6$ and perpendicular to the optic axis of the third optical system or a plane optically equivalent to said plane.

If the reduction magnification of the above-described reflecting reduction optical system according to the present invention is $\beta_t(>0)$ and the magnifications the respective optical systems $S_1$, $S_2$ and $S_3$ are $\beta_{S1}$, $\beta_{S2}$ and $\beta_{S3}$, $$\beta_t = \beta_{S1} \cdot \beta_{S2} \cdot \beta_{S3}.$$

The present optical system is basically designed such that $\beta_{S1} = 1.0$, $\beta_{S2} = -\beta_t$ and $\beta_{S3} = -1.0$. That is, the substantial reduction of the image is accomplished by the second optical system $S_2$ Also, the real image $I_2$ formed by the second optical system $S_2$ is re-imaged by the third optical system $S_3$, which substantially functions as a relay optical system of one-to-one magnification.

Generally in concentric optical systems, the optic axis thereof cannot be primarily defined, but in the case of one-to-one magnification like that of the first optical system or the third optical system, the object plane and the image plane are set in a plane containing the center of concentricity and therefore, the optic axis can be defined as a straight line passing through the center of concentricity and perpendicular to said plane. Design is made such that the optic axes $A_1$, $A_2$ and $A_3$ of the optical systems $S_1$, $S_2$ and $S_3$, respectively, are optically coincident with each other and all of the reflecting surfaces have their centers of curvature on this optic axis.

The specific construction of each optical system in the present invention will hereinafter be described.

The first optical system $S_1$. as shown in FIG. 10, has a concave mirror $R_1$ and a convex mirror $R_2$ as a first reflecting surface and a second reflecting surface, respectively, disposed substantially concentrically. The object plane O and image $I_1$ (a virtual image of one-to-one magnification) of the first optical system $S_1$ lie in a plane containing the center of concentricity and perpendicular to the optic axis $A_1$. By such an arrangement, the spherical aberration caused by the first optical system $S_1$ and the coma in the 3rd-order aberration area are eliminated. Further, there is no curvature of image field caused by the sagittal light flux in the 3rd-order aberration area. The curvature of image field caused by the meridional light flux cannot be corrected in the first optical system, but by adding the third optical system $S_3$ and making Petzval sum zero as will be described later, it becomes possible to eliminate the curvature of image field caused by the meridional light flux.

It is effective to make an aperture stop coincident with the convex mirror $R_2$ as the second reflecting surface, dispose the second reflecting mirror $R_2$ at a location intermediate of the object plane O and the concave mirror $R_1$ as the first relfecting surface and thereby provide an optical system telecentric relative to the object plane, as in an embodiment which will be described later. However, this is not restrictive.

The second optical system $S_2$, as shown in FIG. 11, has a convex mirror $R_3$ and a concave mirror $R_4$ as a third reflecting surface and a fourth reflecting surface, respectively, disposed substantially concentrically, and a concave mirror $R_5$ as a fifth reflecting surface disposed near the image plane $I_2$ by the third reflecting surface $R_3$ and the fourth reflecting surface $R_4$.

The convex reflecting mirror $R_3$ and the concave reflecting mirror $R_4$ together constitute a conventional Schwarzschild reduction optical system having the virtual image plane $I_1$ by the first optical system $S_1$ as the object plane. This Schwarzschild reduction optical system is an excellent optical system and can eliminate the spherical aberration, coma and astigmatism in the 3rd-order aberration area. However, its only disadvantage is that because of it being concentric optical systems, the object plane and image plane are spherically curved about the point of concentricity of the reflecting mirrors. The curvature of the image plane when the object is planar corresponds to the Petzval image plane. For the solution to this problem, in the optical system of the present invention, a concave reflecting mirror $R_5$ is disposed near the image plane $I_2$ of the Schwarzschild reduction optical system comprised of the convex reflecting mirror $R_3$ and the concave reflecting mirror $R_4$ to thereby correct Petzval sum.

That is, with regard to the Petzval sum $PZ_2$ of the second optical system $S_2$, design is made so as to substantially satisfy the following condition:

$$PZ_2 = \frac{2}{r_3} - \frac{2}{r_4} + \frac{2}{r_5} = 0, \tag{6}$$

where $r_3$ is the radius of curvature of the third reflecting surface $R_3$, $r_4$ is the radius of curvature of the fourth reflecting surface $R_4$, and $r_5$ is the radius of curvature of the fifth reflecting surface $R_5$.

Accordingly, the 3rd-order aberration caused by the second optical system $S_2$ is only distortion aberration.

The third optical system $S_3$, as shown in FIG. 12, has a concave reflecting mirror $R_6$ and is of a construction in which the object plane and image plane are disposed in a plane containing the center of curvature $C_3$ of the concave reflecting mirror $R_6$ and perpendicular to the optic axis $A_3$, and the image I formed by that optical system is the final image of the entire system. The object plane of the third optical system $S_3$ is coincident with the image plane by the second optical system $S_2$, and this position is coincident with the center of curvature $C_3$ of the third optical system. By such arrangement, as in the first optical system $S_1$, spherical aberration, coma and the curvature of image field by the sagittal light flux are eliminated.

The curvature of image field by the meridional light flux which cannot be corrected by the first optical system $S_1$ is corrected by the Petzval sum in the concave reflecting mirror $R_6$ as the sixth reflecting surface.

That is, if the Petzval sum of the first optical system $S_1$ is $PZ_1$ and the Petzval sum of the third optical system $S_3$ is $PZ_3$, $$PZ_1 = \frac{+2}{r_1} - \frac{2}{r_2} > 0$$
$$PZ_3 = \frac{-2}{r_6} < 0$$

where $r_1$ is the radius of curvature of the first reflecting surface $R_1$, $r_2$ is the radius of curvature of the second reflecting surface $R_2$ and $r_6$ is the radius of curvature of the sixth reflecting surface $R_6$, and the condition that $$PZ_1 + PZ_3 = 0 \tag{7}$$

is substantially satisfied. Accordingly, the sum of the 3rd-order aberrations by the first optical system $S_1$ and the third optical system $S_3$ is completely corrected except distortion aberration.

Consequently, the Petzval sum of the entire system is completely corrected.

From the foregoing discussion, it is seen that by combining these three optical systems $S_1$, $S_2$ and $S_3$, the aberrations of the entire system can be corrected except distortion aberration and good imaging can be obtained.

Description will now be made of means for correcting distortion aberration.

A first method, as described above, is to define the magnification of the first optical system $S_1$ as $\beta_1 = 1.0$, define the magnification of the second optical system $S_2$ as $\beta_2 = -\beta_t$ ($\beta_t$ being the magnification of the entire optical system), define the magnification of the third optical system $S_3$ as $\beta_3 = -1.0$ and moreover, suitably select the value of the radius of curvature $r_1$ of the first reflecting surface $R_1$ to thereby make the correction of distortion aberration possible.

A second method is to shift the magnification $\beta_1$ of the first optical system $S_1$ from the value of 1.0 by some amount, that is, somewhat destroy the concentric relation between the first and second reflecting mirrors $R_1$ and $R_2$, thereby correcting distortion aberration. In this case, it becomes necessary that the magnification $\beta_2$ of the second optical system $S_2$ be adjusted so as to keep the magnification $\beta_t$ of the entire optical system. The second optical system $S_2$ includes a so-called Schwarzschild optical system comprising $R_3$ and $R_4$ and therefore, it is possible to maintain the excellent aberration correcting ability as described above and yet obtain any magnification.

BRIEF DESCRIPTION OF THE DRAWINGS

FIG. 7 shows the aberrations in the first embodiment.

FIG. 13 shows the astigmatism in an embodiment of the present invention.

FIG. 14 shows distortion aberration.

FIG. 15 shows lateral aberration.

DESCRIPTION OF THE PREFERRED EMBODIMENTS

The invention will hereinafter be described in detail with respect to some embodiments thereof.

Figure 1:
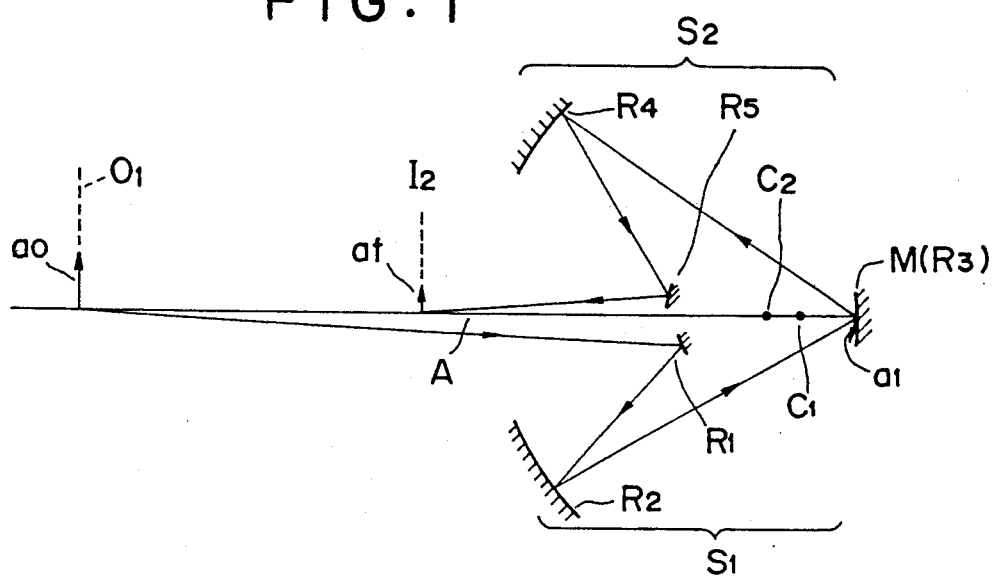
FIG. 1 shows the construction of a first embodiment of the present invention.

FIG. 1 is a cross-sectional optical path view showing the construction of a first embodiment of the present invention, and shows the manner in which a principal light ray emitted from the on-axis point of an object $a_0$ arrives at a final image $a_f$. As shown, the first embodiment is comprised of a first Schwarzschild type concentric optical system $S_1$ . comprising a first reflecting mirror $R_1$ which is a convex mirror having $c_1$ as its center of sphericity and a second reflecting mirror $R_2$ which is a concave mirror, and a second Schwarzschild type concentric optical system $S_2$ comprising a third reflecting mirror $R_3$ as an image plane correcting mirror M, a fourth reflecting mirror $R_4$ which is a concave mirror having $c_2$ as its center of sphericity and a fifth reflecting mirror $R_5$ which is a convex mirror. The first Schwarzschild type concentric optical system is a reduction system, and the second Schwarzschild type concentric optical system is an enlargement system.

The light flux from the object $a_0$ is reflected by the convex mirror $R_1$ as the first reflecting surface and the concave mirror $R_2$ as the second reflecting mirror and forms an intermediate image $a_1$. The intermediate image $a_1$ is curved, and is further curved by the concave mirror $R_3$ as the third reflecting mirror disposed near the intermediate image $a_1$ and forms an image $a_2$. The light flux subjected to the reflection by the concave mirror $R_3$ as the third reflecting mirror disposed near the intermediate image $a_1$ is reflected by the concave mirror $R_4$ as the fourth reflecting surface and the convex mirror $R_5$ as the fifth reflecting surface and forms the final image $a_f$.

Figure 2:
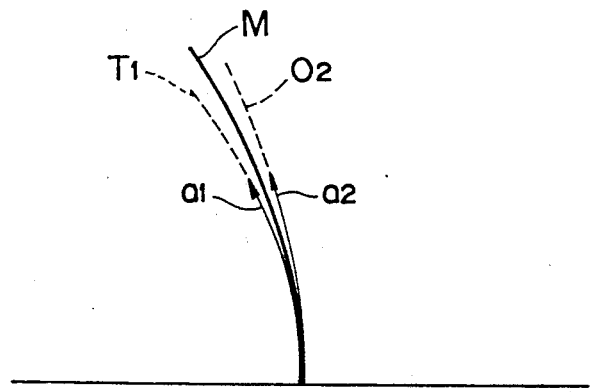
FIG. 2 illustrates the function of a reflecting mirror for correcting curvature of image field.

The intermediate image $a_1$ is moderately curved as the reflected image $a_2$ by the third reflecting mirror $R_3$ as the image plane correcting mirror M, as described with reference to FIG. 2, and therefore curvature of image field created by the first and second Schwarzschild optical systems is corrected and the final image $a_f$ is formed into a flat plane. In such a construction, to better the telecentricity on the image side so that the principal light ray forming the final image $a_f$ may be substantially parallel to the optic axis, it is effective to slightly incline the third reflecting mirror $R_3$ as the image plane correcting mirror.

In the above-described first embodiment, the first Schwarzschild optical system and the second Schwarzschild type concentric optical system are combined as a reduction system and an enlargement system, respectively, to reduction-image the final image, but the present invention is not restricted to such a combination. That is, the enlargement and reduction of a Schwarzschild type concentric optical system should be suitably selected and combined, and it is also possible that a so-called Offner type concentric optical system of one-to-one magnification comprising a concave reflecting mirror and a convex reflecting mirror is used as the concentric optical system.

Figure 3:
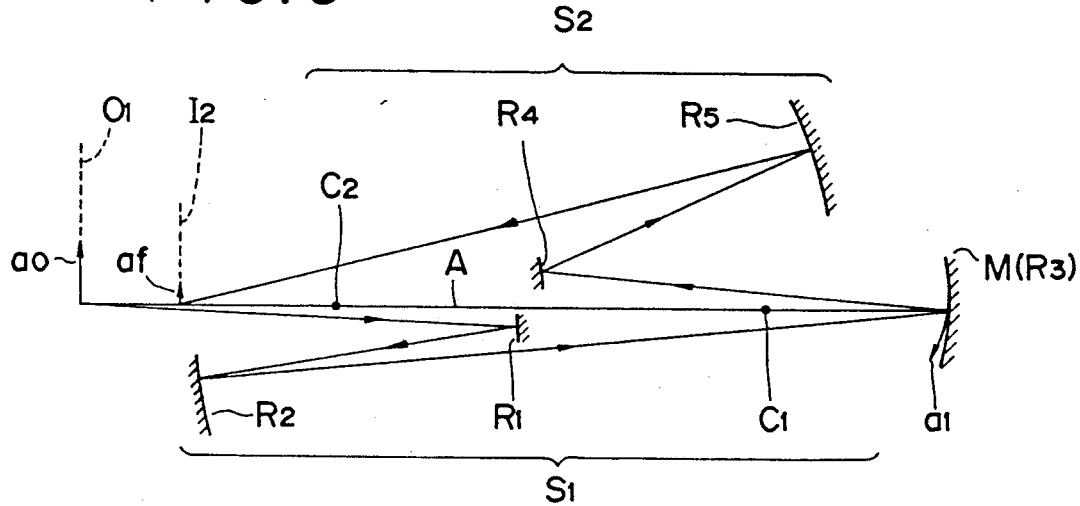
FIG. 3 shows the construction of a second embodiment.

The construction of a second embodiment shown in FIG. 3 is such that two Schwarzschild type concentric optical systems combined as reduction systems. That is, an intermediate image $a_1$ is formed along the optical path from an object $a_0$ by a first Schwarzschild optical system $S_1$ comprising a convex reflecting mirror $R_1$ as a first reflecting mirror and a concave mirror $R_2$ as a second reflecting surface having the center of concentricity $C_1$, and a final image $a_f$ is formed by a second Schwarzschild optical system $S_2$ comprising a convex reflecting mirror $R_1$ as a fourth reflecting mirror and a concave mirror $R_5$ as a fifth reflecting surface having the center of concentricity $C_2$, through the reflection by an image plane correcting mirror M.

Figure 4:
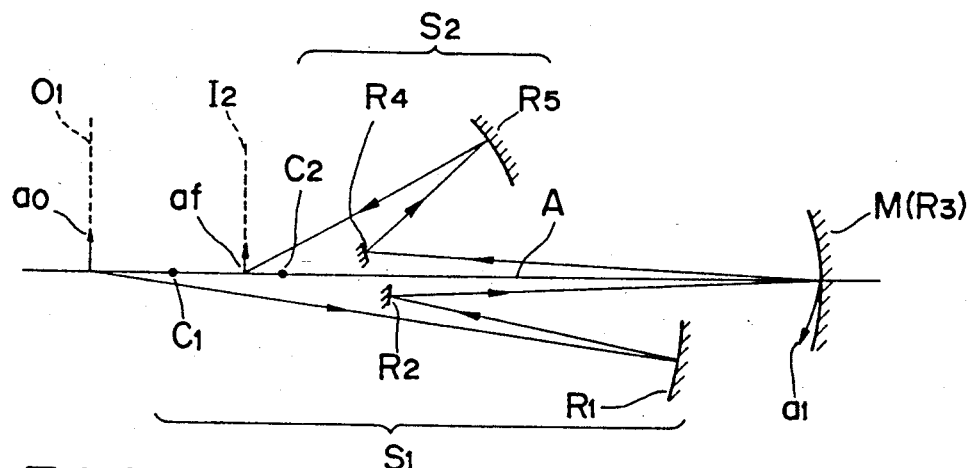
FIG. 4 shows the construction of a third embodiment.

The construction of a third embodiment shown in FIG. 4 is such that a first Schwarzschild optical system $S_1$ and a second Schwarzschild optical system $S_2$ are combined as an enlargement system and a reduction system, respectively. That is, an intermediate image $a_1$ is formed along the optical path from an object $a_0$ by the first Schwarzschild optical system $S_1$ comprising a concave reflecting mirror $R_1$ as a first reflecting mirror and a convex mirror $R_2$ as a second reflecting surface having the center of concentricity $C_l$, and a final image $a_f$ is formed by the second Schwarzschild optical system $S_2$ comprising a convex reflecting mirror $R_1$ as a fourth reflecting mirror and a concave mirror $R_5$ as a fifth reflecting surface having the center of concentricity $C_2$, through the reflection by an image plane correcting mirror M.

Again in these embodiments, the radius of curvature of the reflecting mirror M for correcting the image plane is given by the equation (2) above, and a flat reduced image $a_f$ of the planar object $a_0$ is formed clearly.

Figure 5:
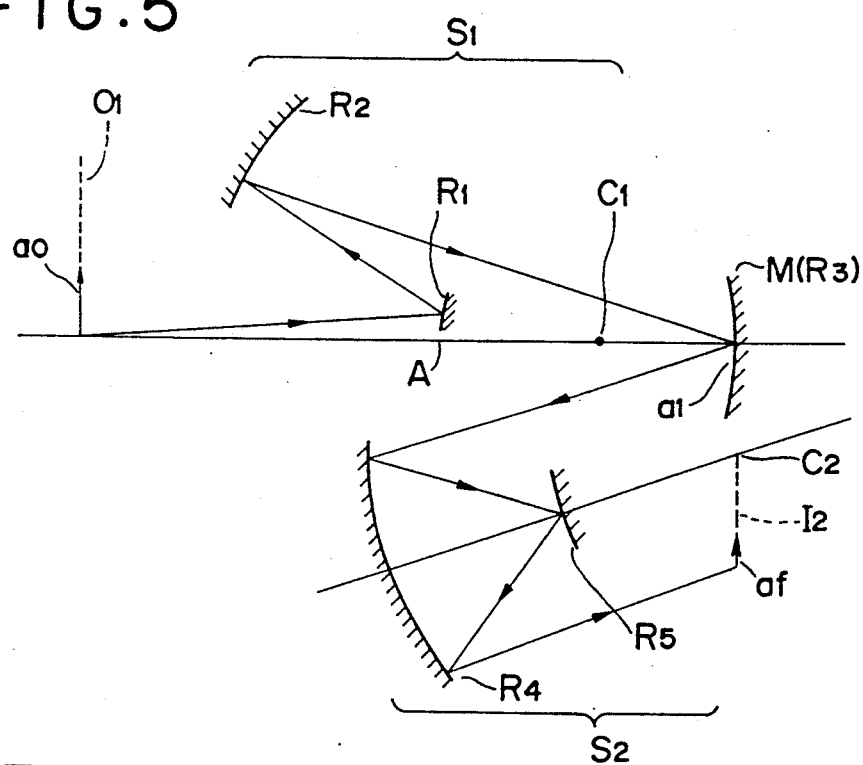
FIG. 5 shows the construction of a fourth embodiment.
Figure 8:
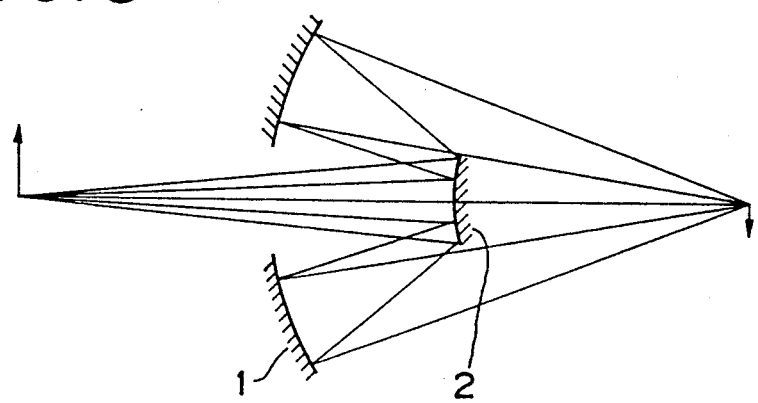
FIG. 8 exemplarily shows a conventional Schwarzschild optical system.

A fourth embodiment shown in FIG. 5 uses a Schwarzschild optical system $S_1$ as a reduction system on the object side and a concentric system $S_2$ of one-to-one magnification on the image side. The one-to-one magnification system is not of the Schwarzschild type, but is a so-called Offner type one of a construction which comprises a combination of a concave mirror and a convex mirror and reflection is effected once by the concave mirror before and after the reflection by the convex mirror. Specifically, an intermediate image a1 is formed along the optical path from an object $a_1$ by the Schwarzschild optical system $S_1$ as a first concentric optical system comprising a convex reflecting mirror $R_1$ as a first reflecting mirror and a concave mirror $R_2$ as a second reflecting surface having the center of concentricity $C_1$, and a final image $a_f$ is formed by the Offner type second concentric optical system $S_2$ comprising a concave reflecting mirror $R_4$ as a fourth reflecting surface having the center of concentricity $C_2$ and a convex reflecting mirror $R_5$ as a fifth reflecting surface, through the reflection by an image plane correcting mirror M. The second concentric optical system $S_2$ is an Offner optical system of one-to-one magnification and thus, the final image $a_f$ lies off the optic axis, but as in the aforedescribed embodiments, the intermediate image $a_1$ is curved, whereas the final image $a_f$ is formed as a flat image lying in this plane. In this fourth embodiment, it is effective to incline the object plane $a_0$ with respect to the optic axis in order that the principal light ray arriving at the final image $a_f$ may be maintained perpendicular to the image plane.

As described above, a projection optical apparatus of a desired reduction magnification is constructed by combining a plurality of concentric optical systems, and the construction of the first embodiment shown in FIG. 1 can obtain a flat image over the largest area and is advantageous in making the exposure area large.

Figure 6:
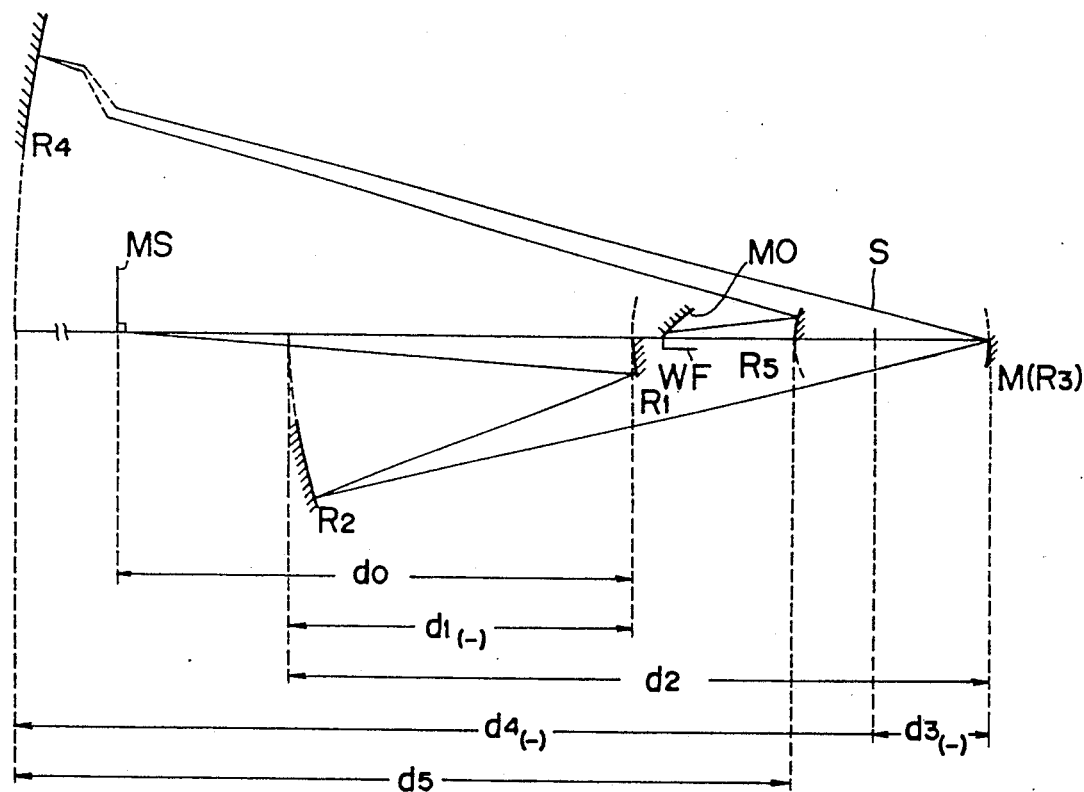
FIG. 6 shows a specific example of the numerical values of the first embodiment shown in FIG. 1.

A specific example of the construction comprising a combination of the two Schwarzschild type concentric optical systems shown in FIG. 1 is shown in FIG. 6.

In FIG. 6, MS designates an object to be projected such as a mask (reticle) corresponding to said object $a_0$, and WF denotes an exposure surface such as a wafer surface onto which said final image $a_f$ is transferred. $M(R_3)$ designates a surface for correcting curvature of image field, and the other members identical to those in FIG. 1 are given identical reference characters. In the construction shown in FIG. 6, a stop S is disposed in the optical path between the third reflecting surface for correcting the image plane and the fourth reflecting surface. A plane mirror $M_0$ is provided to avoid the final image mechanically contacting with the first reflecting mirror $R_1$.

As shown in FIG. 6, it is to be understood that the direction in which the light rays travel from left to right is positive, the radius of curvature r of the reflecting surface having its convex surface facing the left is positive, the radius of curvature r of the reflecting surface having its concave surface facing the left is negative, and the surface spacing d is positive in a medium wherein the direction of travel of the light rays is positive, and negative in a medium wherein the direction of travel of the light rays is negative, and the values of these elements are shown in the table below. In the table, $d_0$, as shown in FIG. 6, is the distance from the object plane to the vertex of the first reflecting surface, and $d_6$ is the distance from the vertex of the fifth reflecting surface to the final image plane.

TABLE 1

Magnification = ⅓   NA = 0.02
Image plane size $\phi$ = 20 mm = Image height Y = 20 mm

| | |
|---|---|
| $r_1$ = 595.27679 | |
| $r_2$ = 2163.40741 | |
| $r_3$ = −300.90422 | (M: reflecting surface for correcting image plane) |
| $r_4$ = 4347.90820 | |
| $r_5$ = 426.12529 | |
| $d_0$ = 2059.02029 | |
| $d_1$ = −1575.26720 | |
| $d_2$ = 2634.39929 | |
| $d_3$ = −222.74000 | |
| $d_4$ = −4459.64835 | |
| $d_5$ = 3945.38501 | |
| $d_6$ = −238.79334 | |

In the above specific example of the numerical values, the object plane is a flat plane and the image plane also is a flat plane, and the radius of curvature $R_{11}$ of the image plane by the first concentric optical system $S_1$ is −410.625, and the radius of curvature $R_{02}$ of the object plane with respect to the second concentric optical system $S_2$ is −236.213. Accordingly, it is seen that the value of the radius of curvature $r_3$ of the third reflecting surface as the reflecting surface for correcting curvature of image field is a value substantially mean of said radii of curvature.

Also, as regards the condition of the formula (5) relating to Petzval sum, the value of the radius of curvature $r_M$ of the relfecting surface for correcting the image plane which is determined by the equation (4) is $r_M$ = 299.90502.

In the present embodiment, if the wavelength λ is λ = 100 Å, the final image height Y is Y = 20 mm and the numerical aperture NA of the final imaging light flux is NA = 0.02 and therefore, the value of the right side of the formula (5) is as follows:

$$\frac{\lambda}{Y^2(NA)^2} r_{M2} = 5.6 \text{ mm}$$

In contrast, as described above, the radius of curvature $r_3$ of the reflecting surface for correcting the image plane (the third reflecting surface) is $-300.90422$ and the value of the left side of the formula (5) is $$|r - r_M| = 0.9992$$

and thus, it is seen that the condition (5) is satisfied.

The astigmatism, distortion aberration and lateral aberration regarding the final image in the construction of the above-mentioned numerical values are shown in FIG. 7.

As can be seen from FIG. 7, the image plane is corrected substantially well over the image height 20 mm, and both distortion aberration and lateral aberration are corrected very well, and it is apparent that the present embodiment has an excellent imaging performance at a reduction magnification of $\frac{1}{5}$.

As described above, according to the present invention, there is achieved a reflecting imaging optical apparatus which is of a simple construction comprising only spherical surfaces and yet can provide a flat image of high resolution over a wide area and is capable of reduction projection, and this apparatus is very useful as an X-ray exposure apparatus which cannot use a refracting system. It is also possible to improve the telecentricity of the image side by inclining the spherical reflecting mirror for correction or the object plane, and this apparatus can be made more suitable as an exposure apparatus.

Figure 9:
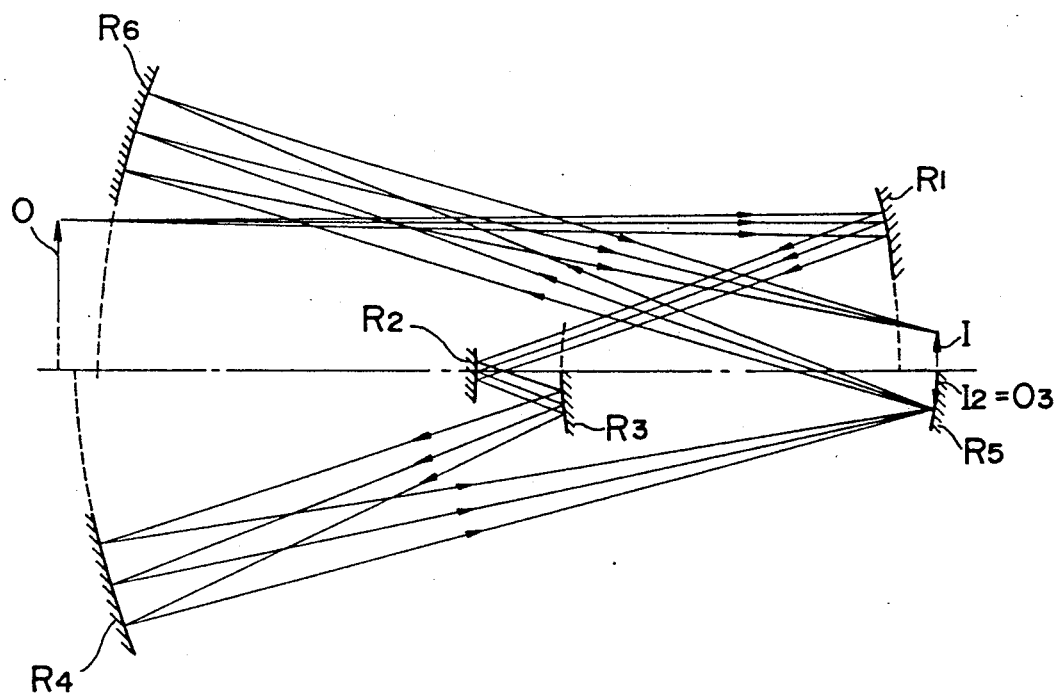
FIG. 9 schematically shows the construction of a reflecting reduction optical apparatus according to the present invention.
Figure 10:
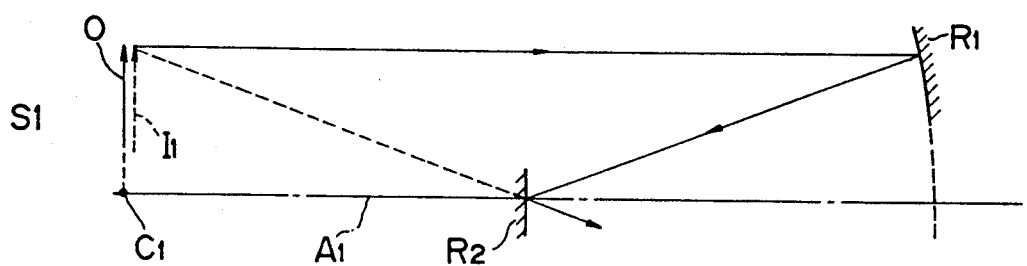
FIG. 10 shows the construction of a first optical system in the present invention.
Figure 11:
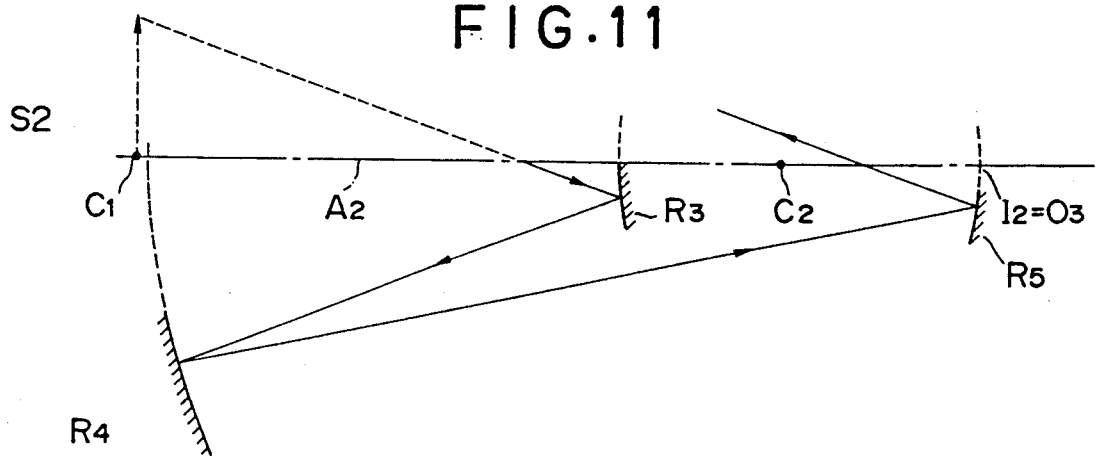
FIG. 11 illustrates a second optical system in the present invention.
Figure 12:
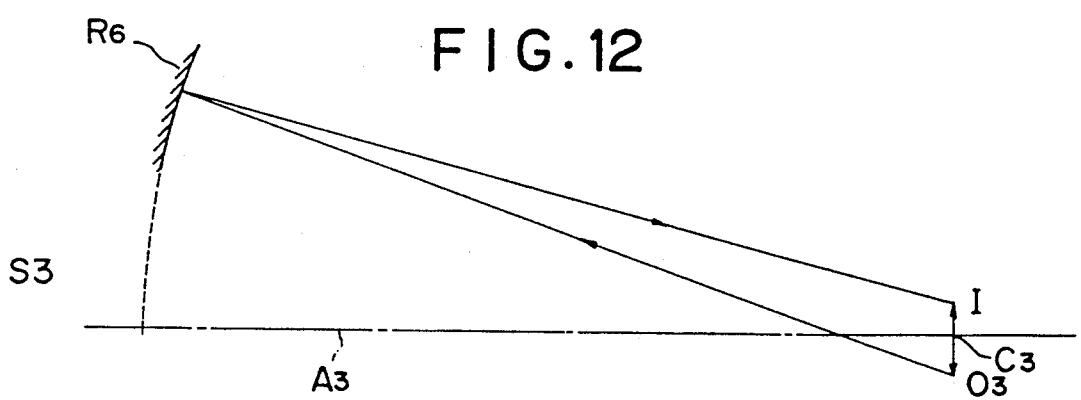
FIG. 12 illustrates a third optical system in the present invention.

A specific example of the numerical values in another embodiment of the present invention is shown in Table 2 below. In this table, the radii of curvature, the surface spacings and the refractive indices of respective surfaces are represented in the order from the object plane 0 side toward the final image plane I. As regards light rays, in the construction shown in FIG. 9, it is to be understood that the direction in which the light rays travel from left toward right is positive, the radius of curvature of a curved surface having its convex surface facing the left is positive, the radius of curvature of a curved surface having its concave surface facing the left is negative, and the surface spacing is positive in a medium wherein the direction of travel of the light rays is positive, and negative in a medium wherein the direction of travel of the light rays is negative. Also, it is to be understood that in a medium wherein the light rays travel in the positive direction, the refractive index thereof is positive, and in a medium wherein the light rays travel in the negative direction, the refractive index thereof is negative.

TABLE 2

| | Radius of curvature | Surface spacing | Refractive index |
|---|---|---|---|
| $S_1$ | (object plane) | 3260.000 | 1.00 |
| | | $-1630.000$ | $-1.00$ |
| | $r_1$ $-3260.000$ | | |
| | | 433.579 | 1.00 |
| | $r_2$ $-1630.000$ | | |
| | | $-2046.400$ | $-1.00$ |
| $S_2$ | $r_3$ 686.421 | | |
| | | 3282.821 | 1.00 |
| | $r_4$ 2732.821 | | |
| | | $-3260.000$ | $-1.00$ |
| | $r_5$ $-916.666$ (Intermediate image plane) | | |
| $S_3$ | $r_6$ 3260.000 (Final image plane) | 3260.000 | 1.00 |

Magnification: $\beta_t = 1/5$
Numerical aperture: NA = 0.02
Image height: 10–20 mm
Resolving power:
 0.31 μm when wavelength is 100 Å
 0.15 μm when wavelength is 50 Å

In the above-described embodiment, the value of the Petzval sum $PZ_2$ of the second optical system $S_2$ is $$PZ_2 = 0.0000000$$

and satisfies the equation (6) above.

Also, the Petzval sum $PZ_1$ of the first optical system $S_1$ and the Petzval sum $PZ_3$ of the third optical system $S_3$, if calculated, are $$PZ_1 = +0.0006134$$

$$PZ_3 = -0.0006134$$

and satisfy the condition of the equation (7) above.

Accordingly, in the present embodiment, the Petzval sum of the entire system is completely corrected.

Also, in the present embodiment, $\beta_1 = 1.0$, $\beta_2 = -1/5$ and $\beta_3 = -1.0$, and the correction of distortion aberration is made possible by the aforedescribed first method, i.e., by optimizing the radius of curvature $R_1$ of the first reflecting surface.

The astigmatism, distortion aberration and lateral aberration in the above-described embodiment are shown in FIGS. 13, 14 and 15, respectively. In FIG. 13, dotted line M indicates the image plane by the meridional light flux, and solid line S indicates the image plane by the sagittal light flux. In FIG. 15, there are shown the lateral aberrations at the image height Y=20 mm, the image height Y=15 mm and the image height Y=10 mm. From these aberration graphs, it is seen that the reflecting reduction optical system of the present embodiment obtains a very good imaging performance.

In the above-described embodiment, the magnification $\beta_3$ of the third optical system $S_3$ is $\beta_3 = -1.0$, but in order to avoid the contact of the image plane I (in an exposure apparatus, the wafer surface) and the mechanical system around if with the concave mirror $R_5$ as the fifth reflecting surface, and to avoid the contamination of the surface of the concave mirror $R_5$ by the wafer surface and the mechanical system around it, it is desirable to make the angle of inclination of the principal light ray with respect to the optic axis small and approximate the image side to telecentric. For this purpose, it is effective to shift the magnification $\beta_3$ of the third optical system $C_3$ by some amount from the value of $-1$ to thereby provide a somewhat enlarged system $|\beta_3| > 1$.

Also, in the present embodiment, a substantially rectangular mask pattern can be bodily exposed and transferred onto a wafer surface, but this embodiment can also be used in a system wherein use is made of only the image height in a predetermined range in which aberrations are small and a mask (negative) and a wafer are synchronously scanned for exposure. In that case, it is not necessary to make Petzval sum strictly zero as described above.

As described above, according to the present invention, there can be constructed a reduction projecting optical system comprising only reflecting systems and therefore, reduction projection exposure in a soft X-ray or X-ray area becomes possible. Even where it comprises only spherical reflecting mirrors easy to manufacture, this optical system can form a reduced image excellent in resolving power and is therefore very useful as a practical optical apparatus for manufacturing semiconductor elements comprising very minute patterns, such as super-LSIs. Of course, it becomes possible to enhance the degree of freedom of the correction of various aberrations by adopting an aspherical surface as at least one reflecting surface in the present invention.

We claim:

1. A reflecting imaging optical apparatus comprising:
   a reflecting spherical optical system including a first spherical reflecting optical system and a second spherical reflecting optical system;
   said first spherical reflecting optical system and said second spherical reflecting optical system forming concentric optical systems; and
   a spherical reflecting mirror disposed near the position of an intermediate image formed by said reflecting spherical optical system.

2. A reflecting imaging optical apparatus according to claim 1, wherein said spherical reflecting mirror is a concave reflecting mirror, and the radius of curvature thereof is a value corresponding to curvature of image field in said reflecting spherical optical system.

3. A reflecting imaging optical apparatus according to claim 1, wherein said first and second spherical reflecting optical systems form Schwarzschild optical systems, respectively.

4. A reflecting imaging optical apparatus according to claim 2, wherein said first spherical reflecting optical system forms a reduction system, and said second spherical reflecting optical system forms an enlargement system.

5. A reflecting imaging optical apparatus according to claim 2, wherein said first and second spherical reflecting optical systems form reduction systems, respectively.

6. A reflecting imaging optical apparatus according to claim 2, wherein said first spherical reflecting optical system forms an enlargement system, and said second spherical reflecting optical system forms a reduction system.

7. A reflecting imaging optical apparatus according to claim 1, wherein said first spherical reflecting optical system forms a Schwarzschild optical system, and said second spherical reflecting optical system forms a concentric system of one-to-one magnification.

8. A reflection reduction projection optical apparatus comprising:
   a first optical system for forming a virtual image of approximately magnification 1 of an object of an object plane;
   a second optical system for forming a reduced real image from the virtual image formed by said first optical system; and
   a third optical system for forming an image of approximately one-to-one magnification from the real image formed by said second optical system;
   said first optical system having a concave reflecting surface as a first reflecting surface and a convex reflecting surface as a second reflecting surface disposed substantially concentrically, and a predetermined optic axis;
   the object plane and image plane of said first optical system lying in a plane substantially containing the center of concentricity and perpendicular to the optic axis of said first optical system or a plane optically equivalent to said plane;
   said second optical system having a convex reflecting surface as a third reflecting surface and a concave reflecting surface as a fourth reflecting surface disposed substantially concentrically, a fifth reflecting surface disposed substantially at the image position by said third reflecting surface and said fourth reflecting surface, and a predetermined optic axis;
   said third optical system having a concave reflecting surface as a sixth reflecting surface, and a predetermined optic axis;
   the object plane and image plane of said third optical system lying in a plane substantially containing the center of curvature of said sixth reflecting surface and perpendicular to the optic axis of said third optical system or a plane optically equivalent to said plane.

9. A reflection reduction projection optical apparatus according to claim 8, wherein said third reflecting surface and said fourth reflecting surface together form a Schwarzschild optical system.

10. A reflection reduction projection optical apparatus according to claim 8, wherein the following equations are substantially established:

$$\frac{2}{r_1} - \frac{2}{r_2} - \frac{2}{r_6} = 0$$

$$\frac{2}{r_3} - \frac{2}{r_4} + \frac{2}{r_5} = 0$$

where
$r_1$: radius of curvature of said first reflecting surface
$r_2$: radius of curvature of said second reflecting surface
$r_3$: radius of curvature of said third reflecting surface
$r_4$: radius of curvature of said fourth reflecting surface
$r_5$: radius of curvature of said fifth reflecting surface
$r_6$: radius of curvature of said sixth reflecting surface.

* * * * *